(12) United States Patent
Ong et al.

(10) Patent No.: US 9,269,875 B2
(45) Date of Patent: Feb. 23, 2016

(54) LIGHT EMITTER

(75) Inventors: Eng Chuan Ong, Bukit Mertajam (MY);
Meng Ee Lee, Bukit Mertajam (MY);
Chiau Jin Lee, Bayan Lepas (MY)

(73) Assignee: INTELLECTUAL DISCOVERY CO., LTD., Seoul (KR)

( * ) Notice: Subject to any disclaimer, the term of this patent is extended or adjusted under 35 U.S.C. 154(b) by 825 days.

(21) Appl. No.: 12/469,297

(22) Filed: May 20, 2009

(65) Prior Publication Data

US 2010/0296297 A1 Nov. 25, 2010

(51) Int. Cl.
| H01L 33/00 | (2010.01) |
| H01L 33/58 | (2010.01) |
| H01L 33/60 | (2010.01) |
| H01L 33/54 | (2010.01) |
| H01L 33/62 | (2010.01) |

(52) U.S. Cl.
CPC ............... *H01L 33/58* (2013.01); *H01L 33/60* (2013.01); *H01L 33/54* (2013.01); *H01L 33/62* (2013.01); *H01L 2224/48091* (2013.01); *H01L 2224/48247* (2013.01); *H01L 2224/48465* (2013.01)

(58) Field of Classification Search
CPC ....... H01L 33/486; H01L 33/52; H01L 33/54; H01L 33/58; H01L 33/60
USPC ..................... 257/81, 99, 100, 675, 676, 712, 257/E33.058, E33.059
See application file for complete search history.

(56) References Cited

U.S. PATENT DOCUMENTS

| 5,001,609 | A   | * | 3/1991  | Gardner et al. | ............... 362/555 |
| 6,274,890 | B1  | * | 8/2001  | Oshio et al.   | ...................... 257/98 |
| 6,345,903 | B1  | * | 2/2002  | Koike et al.   | ................... 362/241 |
| 6,869,753 | B2  |   | 3/2005  | Chua           |                         |
| 6,914,267 | B2  | * | 7/2005  | Fukasawa et al.| ............... 257/98 |
| 6,936,855 | B1  | * | 8/2005  | Harrah         | ............. 257/88 |
| 7,078,254 | B2  | * | 7/2006  | Loh            | .............................. 438/26 |
| 7,230,280 | B2  |   | 6/2007  | Yaw            |                         |
| 2001/0042865 | A1 | * | 11/2001 | Oshio et al.   | .................... 257/100 |
| 2005/0139846 | A1 | * | 6/2005  | Park et al.    | ........................ 257/98 |
| 2005/0263784 | A1 | * | 12/2005 | Yaw et al.     | ........................ 257/98 |
| 2006/0006404 | A1 | * | 1/2006  | Ibbetson et al.| ................ 257/99 |
| 2006/0157726 | A1 |   | 7/2006  | Loh            |                         |
| 2007/0138497 | A1 | * | 6/2007  | Loh            | .............................. 257/98 |
| 2008/0012036 | A1 |   | 1/2008  | Loh            |                         |
| 2008/0023721 | A1 | * | 1/2008  | Lee et al.     | ........................ 257/99 |
| 2008/0079019 | A1 | * | 4/2008  | Huang et al.   | .................... 257/99 |
| 2008/0089072 | A1 |   | 4/2008  | Kim            |                         |
| 2010/0123156 | A1 | * | 5/2010  | Seo et al.     | ........................ 257/99 |

FOREIGN PATENT DOCUMENTS

WO      WO 2006059828 A1 *  6/2006

* cited by examiner

*Primary Examiner* — Ermias Woldegeorgis
(74) *Attorney, Agent, or Firm* — Fox Rothschild LLP

(57) ABSTRACT

A light emitter is disclosed herein. The light emitter may have a lead frame and a plastic reflector cup. The lead frame may have a planar portion; a bond area having a light-emitting diode attached thereto; and at least two terminals configured for surface mount technology. The reflector cup may be proximate the bond area and may have an opening, wherein light emitted from the light-emitting diode passes through the opening; a side wall extending between the planar portion and the opening; and a clear lens located proximate the opening and attached to the reflector cup. The combination of the lens and the reflector cup causes a light beam originating from the light-emitting diode to be less than fifteen degrees.

15 Claims, 3 Drawing Sheets

LIGHT EMITTER

BACKGROUND

Some cameras and other devices require bright illumination of an area. For example, when a camera is used to capture an image, a strobe may be used. The strobe is typically required to be very bright. Cameras, being portable devices, typically use batteries. Therefore, when a strobe is used, it is beneficial that the strobe use as little power as possible.

Some cameras and other devices use light-emitting diodes (LEDs) to provide a strobe. LEDs typically use less energy than conventional light sources. However, conventional LEDs have a very wide illumination angle, which is typically wider than the scene being captured by the camera. This wide illumination angle results in light being generated, but not used. Thus, the light is wasted and more energy than necessary is used to illuminate the scene being captured.

DETAILED DESCRIPTION

Figure 1:
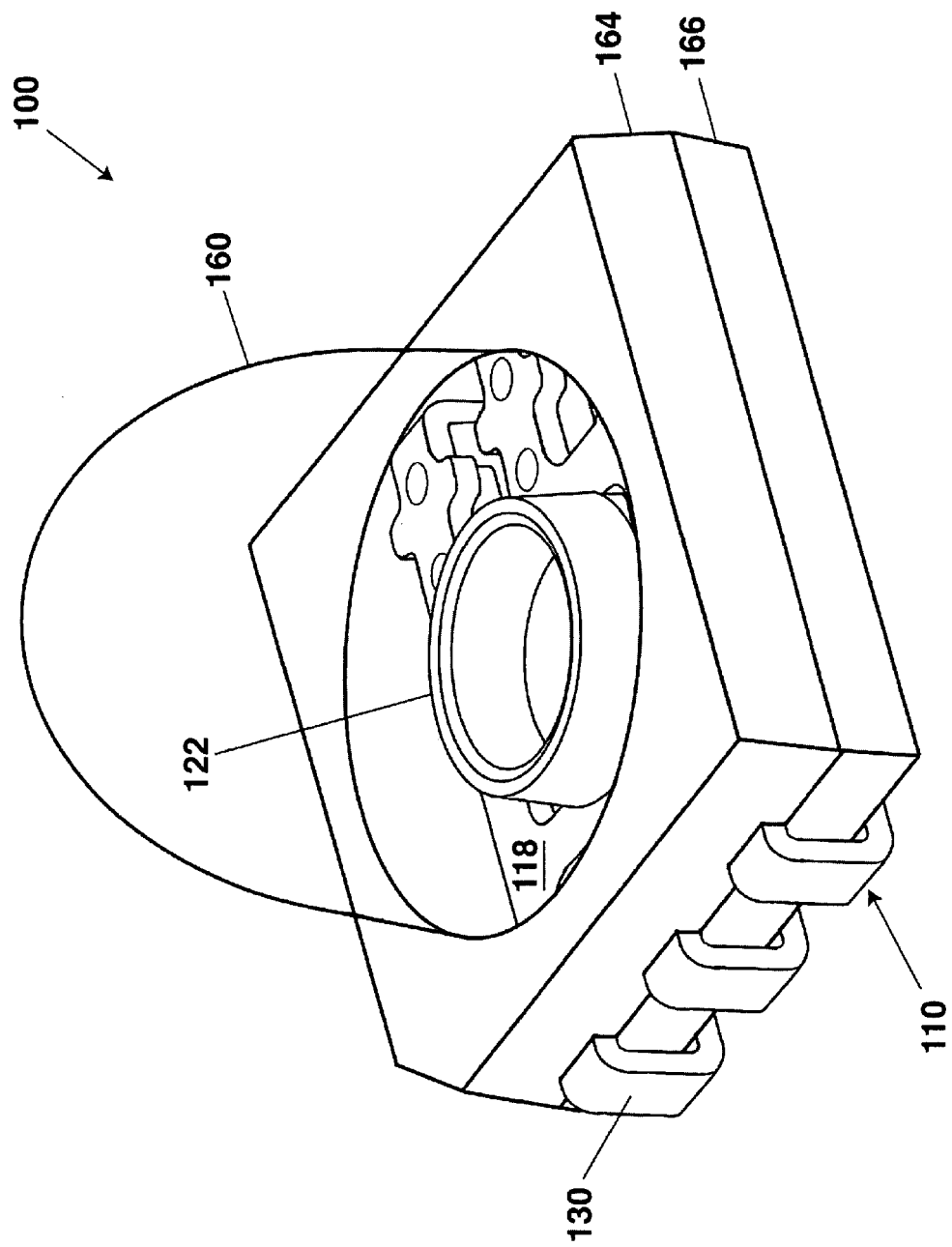
FIG. 1 is a perspective view of an embodiment of a light source.

An embodiment of a light source 100 is shown in FIG. 1. The light source 100 may be of the type used in small cameras where a high intensity of light is required for a small area, which is referred to as a small viewing angle. In some embodiments, the light source 100 emits a light beam that is less than fifteen degrees. The light source 100 may be attached to a circuit board or the like that uses surface mount technology. Accordingly, the light source 100 is adapted for surface mount applications.

Figure 2:
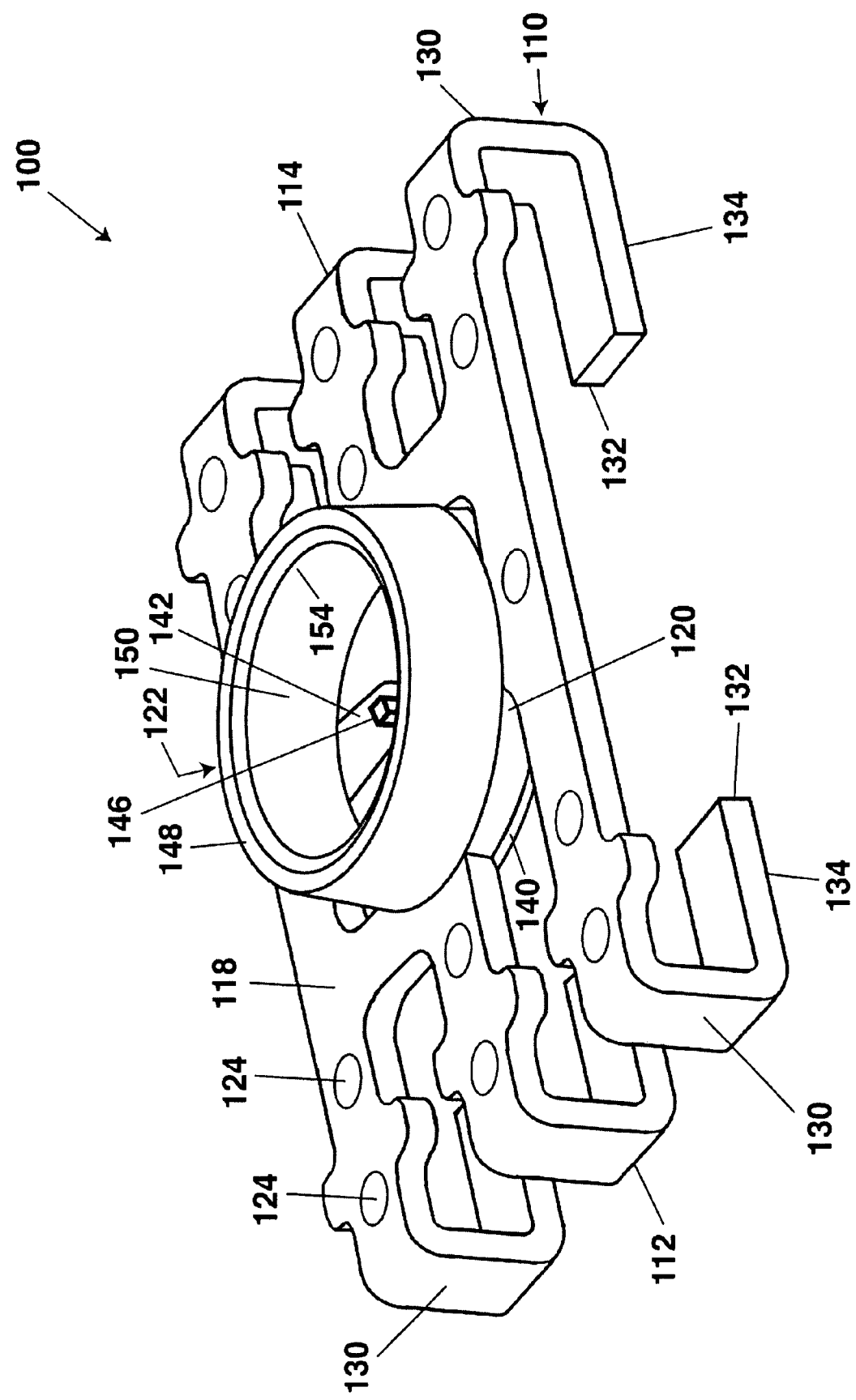
FIG. 2 is a perspective view of some of the components within the light source of FIG. 1.
Figure 3:
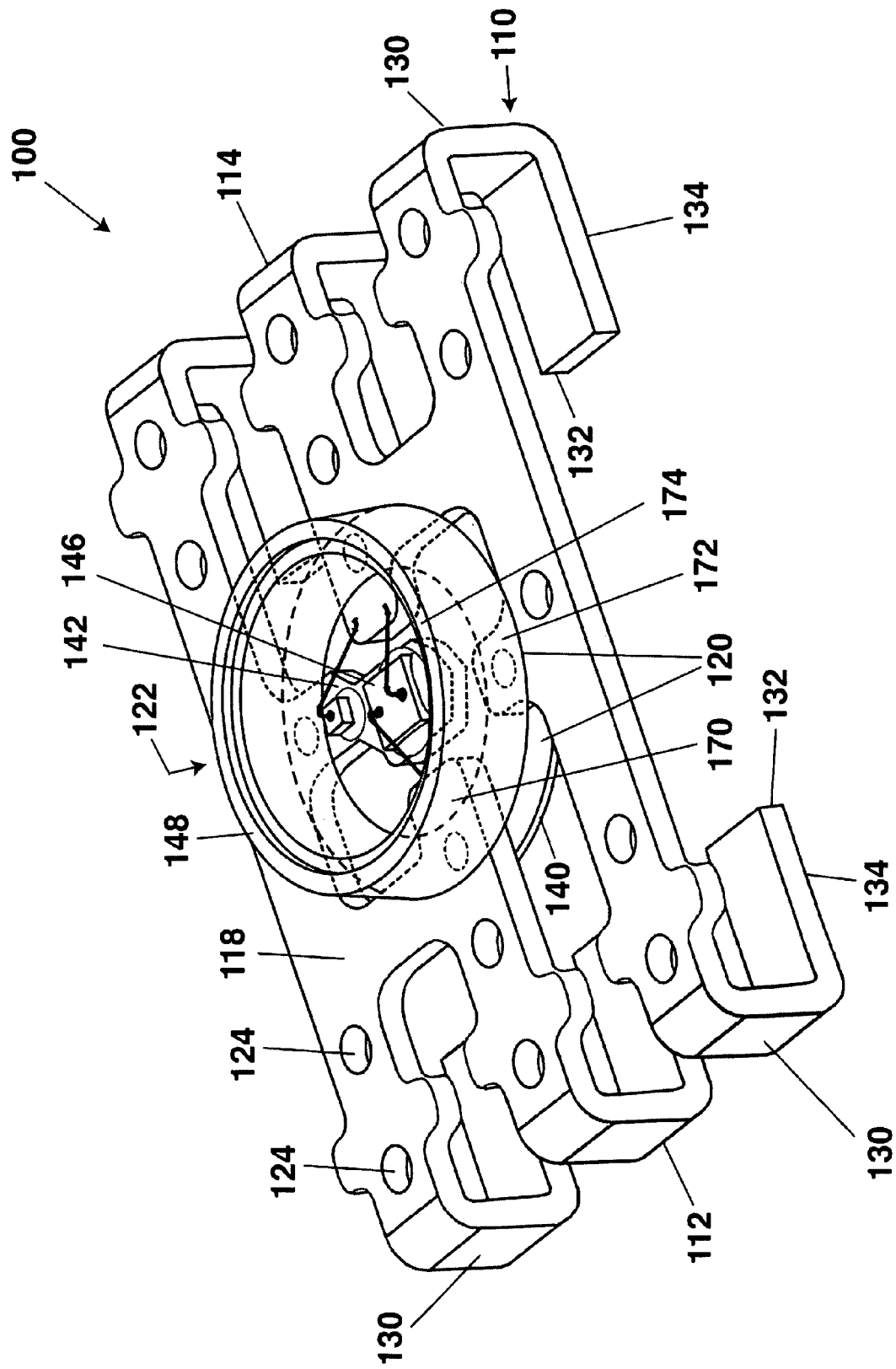
FIG. 3 is a perspective view of the light source of FIG. 2 showing the configuration between the lead frame and the reflector cup.

Reference is made to FIGS. 2 and 3. FIG. 2 is a perspective view showing some of the components within the light source 100. FIG. 3 is the light source of FIG. 2 showing some hidden components. The light source 100 has a lead frame 110. The lead frame 110 is made from a conducting material, such as copper or a silver or gold plated metal. The lead frame 110 may consist of a first lead frame 112 and a second lead frame 114, which constitute the terminals of the light source 100. The first lead frame 112 may be an anode and the second lead frame 114 may be a cathode. The first lead frame 112 and the second lead frame 114 may be connected to each other by insulating devices in order to form the lead frame 110.

The lead frame 110 has a planar portion 118 with a bond area 120 that is used to attach die and wire bonds. As described in greater detail below, the bond area 120 is adapted to receive a reflector cup 122, which may be a plastic reflector cup. The planar portion 118 has holes 124 located therein, which may serve to attach a body or substrate to the lead frame 110 as described below. The lead frame 110 has first portions 130 that extend substantially perpendicular to the planar portion 118. The first portions 130 enable a substrate or body to be affixed to the light source 100 as described in greater detail below.

The lead frame 110 has mounting portions 132 that extend substantially perpendicular to the first portions 130 and substantially parallel to the planar portion 118. The mounting portions 132 have mounting surfaces 134 that are configured for surface mount technology mounting to a circuit board (not shown) or other substrate. For mounting purposes, the mounting surfaces 134 may all be on the same plane.

The reflector cup 122 is located in the bond area 120. In some embodiments, a portion 140 of the reflector cup 122 extends below the planar surface 118, which further secures the reflector cup 122 to the lead frame 110. In some applications, the reflector cup 122 and the lead frame 110 may be manufactured together. For example, lead frame 110 may be etched or stamped and the reflector cup 122 may be molded into or onto the lead frame 110.

In the embodiment of FIG. 3, the lead frame 110, and more specifically, the first lead frame 112, has a mounting surface 142 that is adapted to have a light-emitting diode (LED) 146 attached to it. The mounting surface 142 may be a portion of the first lead frame 110 that extends within the reflector cup 122 and is in the bond area 120. The mounting surface 142 or its associated substrate may have wires or conductors that electrically connect the LED 146 to the lead frames 112, 114. The lead frame 110 has three other mounting surfaces, 170, 172, and 174. It is noted that the number of mounting surfaces is design specific. The mounting surfaces 142, 170, 172, and 174 may be located within the reflector cup 122 in order to be accessible to electrical components located therein.

The reflector cup 122 has a rim 148 that defines an opening 150. The opening 150 allows light generated by the LED 146 to be emitted by the light source 100. At least one sidewall 154 extends between the rim 148 and the mounting surface 142. The sidewall 154 may be shaped so as to reflect light generated by the LED 146 toward the opening 150. It follows that the sidewall 154 may be a color that reflects the light generated by the LED 146. In some embodiments, the reflector cup 122 is filled with an encapsulant. The reflector cup 142 may also be filled with encapsulant with phosphor or the like that changes the color of light emitted by the LED 146. Thus, the color of light emitted by the light source 100 is not limited to colors of light emitted by the LED 146.

With additional reference to FIG. 1, a clear lens 160 covers the reflector cup 122. The lens 160 may be made of a clear material, such as clear silicon or clear epoxy and the lens 160 may be solid rather than a concave structure. In some embodiments, the lens 160 is molded or cast over the plastic reflector cup 122. In such embodiments, the reflector cup 122 and, lens 160 may be formed together as a single unit. Thus, the light source 100 may be void of any air gaps between the LED 146 and the outer surface of the lens 160. The lack of air gaps enables the lens 160 to function better in focusing the light emitted by the LED 146. The lens 160 is shaped in order to provide a narrow light beam emitted from the light source 100. In some embodiments, the height of the lens is less than six millimeters high. In some embodiments, the light beam emitted by the lens 160 is less than fifteen degrees.

For reference purposes, the light source 100 is referred to as having a first cap 164 and a second, cap 166. The first cap 164, the second cap 166, and the lens 160 may be molded or cast to or over the planar portion 118, the reflector cup 122, and the holes 124 in a single molding or casting process. Accordingly, the caps 164, 166, and the lens 160 may be a single unit. The caps 164, 166 serve to seal the light source and to prevent contaminants from entering the light source 100.

The manufacture of the light source 100 may commence with the formation of the lead frame 110. The reflector cup 122 may be molded into the lead frame 110. The lens 160 along with the caps 164, 166 may then be molded to the reflector cup 122 as described above.

The light source 100 described herein has many benefits over conventional light sources. By molding or casting the lens 160 directly to the reflector cup 122, the profile of the lens 160 can be accurately controlled. This controlled lens profile enables the light source 100 to have a preselected or preferred narrow viewing angle. Conventional light sources mold the lens directly to the lead frame rather than to a reflector cup. These conventional light sources waste light with poor reflection and wide viewing angles. Many conventional light sources also cannot produce white light using phosphors and other materials.

Many conventional light sources are cast as a cylindrical shape and do not have the planar portion 118 or the mounting surfaces 134 described above. These cylindrical light sources do not function with surface mount technology. Some conventional light sources drill into a printed circuit board in order to form a reflector cup. The problem with these light sources is that they are prone to moisture in the reflector cup which degrades the phosphor used to convert the light. Other conventional light sources do not use the lens 160 as described herein and cannot achieve the narrow light beam described above.

What is claimed is:

1. A light emitter comprising:
    a lead frame comprising:
    a planar portion having a plurality of holes passing through two opposing surfaces of the planar portion;
    a bond area having a light-emitting diode attached thereto; and
    at least two terminals configured for surface mount technology;
    a reflector cup proximate the bond area, the reflector cup comprising:
    an opening, wherein light emitted from the light-emitting diode passes through the opening;
    a side wall extending between the planar portion and the opening;
    a single layer clear lens directly contacting the planar portion and directly over at least some of the plurality of holes, proximate the opening and attached to the reflector cup, the lens also covering the reflector cup such that all of the side wall is surrounded by and contained within the lens, wherein the combination of the lens and the reflector cup narrows a light beam originating from the light-emitting diode; and
    a first body located on the planar portion, the first body attached to and surrounding the lens,
    wherein the reflector cup is disposed between at least one of the plurality of holes and the light emitting diode in a plan view.

2. The light emitter of claim 1, wherein the lead frame comprises at least one first portion extending substantially perpendicular to the planar portion.

3. The light emitter of claim 2, wherein the at least one first portion has at least one second portion extending substantially perpendicular to the first portion, the at least one second portion comprising a mounting surface for surface mount technology.

4. The light emitter of claim 1, wherein the reflector cup and the first body are formed as a single unit and wherein at least a portion of the reflector cup extends below the planar portion.

5. The light emitter of claim 1 and further comprising a second body located adjacent the planar portion and opposite the lens.

6. The light emitter of claim 5, wherein the first body, the second body, and the lens are a single unit.

7. The light emitter of claim 1, wherein the lens is solid.

8. The light emitter of claim 1, wherein the lens comprises clear silicon.

9. The light emitter of claim 1, wherein the lens comprises clear epoxy.

10. The light emitter of claim 1, wherein the lens is molded to the reflector cup and also covers at least a portion of the planar portion extending outside the reflector cup.

11. The light emitter of claim 1, wherein the lens is cast with the reflector cup and also covers at least a portion of the planar portion extending outside the reflector cup.

12. The light emitter of claim 1, wherein the lens is less than six millimeters high.

13. The light emitter of claim 1, wherein light emitted from the light emitter has a beam width of less than fifteen degrees.

14. The light emitter of claim 1, wherein the reflector cup is at least partially filled with a material that changes the color of perceived light emitted by the light emitting diode.

15. The light emitter of claim 14, wherein the material is phosphor.

* * * * *